United States Patent [19]

Seeger et al.

[11] 4,135,118
[45] Jan. 16, 1979

[54] SYSTEM FOR DETERMINING THE RELATIVE ANGULAR POSITIONS OF THE ROTORS OF TWO SYNCHRONOUSLY DRIVEN SYNCHRONOUS MOTORS

[75] Inventors: Arnold Seeger, Herzogenrath; Wilfried Schalt, Jülich, both of Germany

[73] Assignee: Kernforschungsanlage Jülich Gesellschaft mit beschränkter Haftung, Jülich, Germany

[21] Appl. No.: 729,877

[22] Filed: Oct. 5, 1976

[51] Int. Cl.² ............................................. G05B 19/28
[52] U.S. Cl. ........................................ 318/85; 318/41; 318/44; 318/59
[58] Field of Search ..................... 318/85, 70, 78, 41, 318/44, 59, 313, 314, 318, 625

[56] References Cited

U.S. PATENT DOCUMENTS

| | | | |
|---|---|---|---|
| 3,675,098 | 7/1972 | Heiberger | 318/85 |
| 3,803,464 | 4/1974 | Kuroyanagi | 318/85 |
| 3,833,843 | 9/1974 | Bossons | 318/314 X |
| 3,997,828 | 12/1976 | Bottcher et al. | 318/85 X |

Primary Examiner—B. Dobeck
Attorney, Agent, or Firm—Karl F. Ross

[57] ABSTRACT

A system for determining the relative angular positions of two magnetic-pole rotors of respective synchronously driven (same speed) synchronous motors operated from a common frequency generator applying the driving frequency to the motors. Each rotor is provided with an optoelectronic device generating an electronic pulse for each revolution of the rotor. The pulse of one optoelectronic device is applied to the start input of a start-stop counter. The pulse from the other device is applied to the stop input of the counter and the pulse-counting input receives its signals from a frequency multiplier connected to the frequency generator.

5 Claims, 1 Drawing Figure

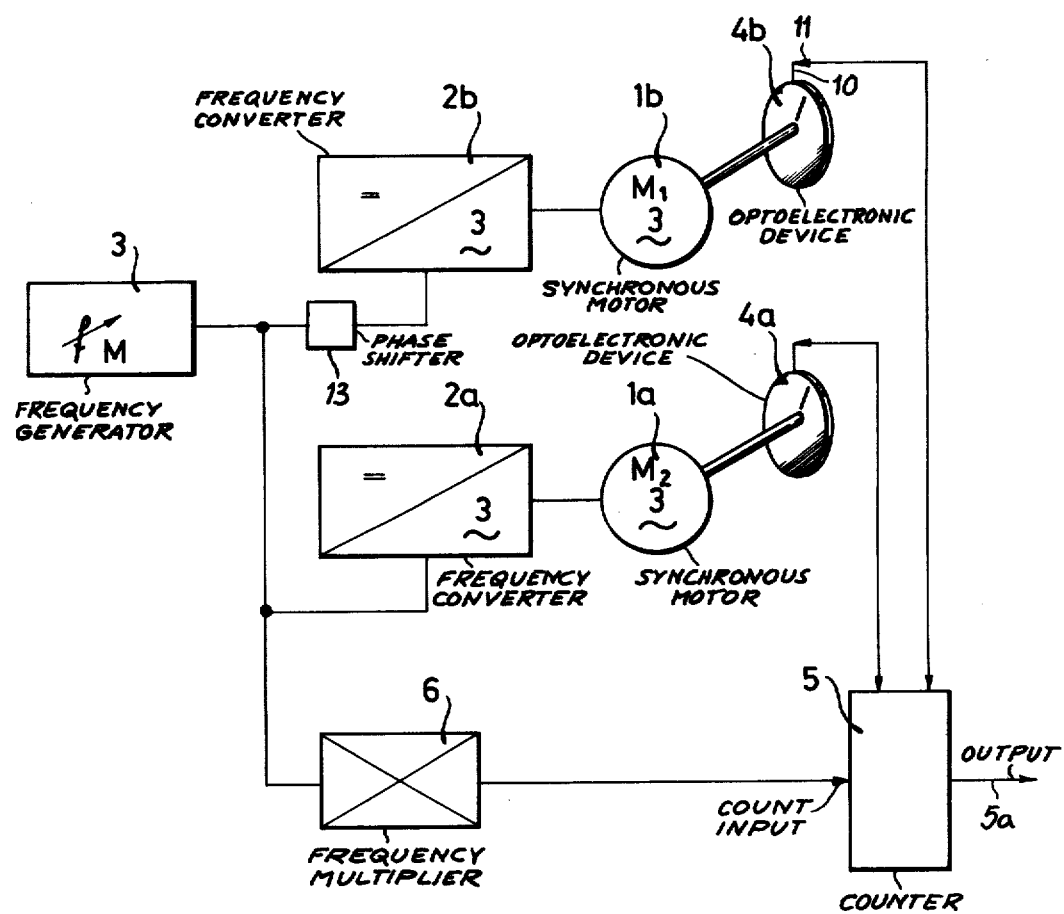

SYSTEM FOR DETERMINING THE RELATIVE ANGULAR POSITIONS OF THE ROTORS OF TWO SYNCHRONOUSLY DRIVEN SYNCHRONOUS MOTORS

CROSS-REFERENCE TO RELATED APPLICATION

The present application is related to our commonly assigned concurrently filed copending application Ser. No. 729,875 now U.S. Pat. No. 729,877.

FIELD OF THE INVENTION

The present invention relates to a system (method and apparatus) for determining the relative angular positions of two magnetic-pole rotors of respective synchronously driven synchronous motors operated from a common frequency generator.

BACKGROUND OF THE INVENTION

In neutron spectrometry and especially time-of-flight spectrometry, use is generally made of rotating mechanical selector and chopper systems for the purpose of neutron energy selection. A nuclear reactor or other neutron source delivers a neutron beam having a wide energy spectrum, i.e. a wide range of neutron velocities. The chopper and mechanical selector system is intended to derive from the broad-spectrum beam of neutrons, a monochromatic beam, i.e. a beam of neutrons which are substantially monoenergetic or of the same velocity.

Monochromatization in this manner is usually done roughly by drum selectors in which the drum consists of a neutron-absorbent material provided with axial and helical grooves. At a fixed speed of the drum, only neutrons of a specific velocity can pass. For the elimination of harmonics and further "rectification" or resolution of the beam, disk choppers are provided. The disks consist of neutron-absorbing material and are provided with windows. Usually a plurality of such disks are arranged in series. Since the more drums and disks which are arranged in series for a given neutron beam, the greater will be the sharpness of the resolution and the manner and energetic character of the resulting beam, it is desirable to provide numerous disks driven absolutely synchronously with a given angular offset of the disks.

To this end it is a common practice to make use of synchronous motors driven by a common frequency generator, usually a quartz-controlled oscillator.

In such systems it is important to determine the relative angular positions of the disks of two such chopper motors and hence the relative angular positions of the magnetic-pole rotors of these synchronous motors.

It is known, in this connection, to provide a start-stop pulse counter which responds to pulses generated by an optoelectronic device connected to the pole rotor of each motor. The counter is triggered by a pulse from the frequency generator and stopped when a zero mark of the pole rotor triggers its optoelectronic device. Between the start and stop signals, a number of pulses are counted corresponding to the subdivisions or traces carried by the rotor. The relative angular positions of the rotors of the two synchronous motors is the difference between the two counted pulse trains.

The disadvantage of this system is that the precision of the measurement, which depends upon the markings carried by the rotors, is limited at higher angular velocities of the synchronous motors.

OBJECTS OF THE INVENTION

It is the principal object of the present invention to provide a device for measuring the relative angular positions of the pole rotors of two synchronously driven synchromotors operated from a common frequency generator which is simpler than the prior-existing systems for this purpose.

Another object of the invention is to provide a system of this class which can provide directly an indication of the relative angular positions of the rotors of synchronous motors driven at the same angular frequency which is independent of the speed of the synchronous motors and thus provides high precision.

Still another object of the invention is to provide a system of the type described which has an electrical or electronic output signal representing the relative angular positions of the rotors of two synchronous motors such that this output can be used for control or other purposes.

SUMMARY OF THE INVENTION

These objects are attained, in accordance with the present invention, in a system which comprises a pair of synchronous motors each driven at the same angular frequency from a common frequency generator, the rotors of these motors each being provided with an optoelectronic device generating a pulse for each rotation of the respective rotor. The pulse from the optoelectronic device of one of these rotors is applied to the start input as a start pulse while the pulse from the other optoelectronic device is applied to the stop input as a stop pulse of a start-stop counter.

According to the invention, the count input of the counter receives a train of pulses through a frequency multiplier from the frequency generator. Thus the number of pulses recorded in the counter in the time interval between the start and stop pulses is a multiple of the number of pulses generated by the frequency generator during the same interval.

With the system of the present invention, therefore, the zero position of each of the rotors carries a marking to which the optoelectronic device returns to produce the start and stop pulses mentioned earlier. If one rotor lags the other, the pulse count will be started when the first rotor sweeps its zero mark past its optoelectronic device, the pulse count accumulating until the second rotor sweeps its mark past the second optoelectronic device. The registered count is thus proportional to the angular offset between the two rotors. Since this pulse count is proportional on the one hand to the frequency of the frequency generator and, on the other hand, is inversely proportional to the speed of the motor, the registered count is independent of the speed of the synchronous motors and is always the same for equal angular offsets of the rotors of the two motors. Since the multiplication factor or multiplier can be selected at will, an extremely large number of pulses can be counted in the time interval, so that even with high speeds of the motors, a high precision can be obtained.

BRIEF DESCRIPTION OF THE DRAWING

The above and other objects, features and advantages of the present invention will become more readily apparent from the following description, reference being made to the accompanying drawing in which the sole FIGURE is a block diagram illustrating a system according to the invention.

SPECIFIC DESCRIPTION

In the drawing, we have shown a pair of three-phase synchronous motors 1a and 1b respectively energized by the three-phase outputs of a pair of frequency converters 2a and 2b from a common frequency generator 3. Each of the motors 1a and 1b has a respective optoelectronic device 4a and 4b respectively supplying pulses to the start and stop inputs of a pulse counter 5. The count input of the pulse counter 5 receives its input from a frequency multiplier 6 connected to the frequency generator 3. Each of the optoelectronic devices comprises a mark 10 carried by the respective rotor and scanned by a photoelectric device 11. The chopper disks are shown at 12.

In the interval between the start and stop pulses, the counter 5 accumulates a count which is a multiple of the frequency of the frequency generator 3 during this interval. The multiplier may be of the phase-locked loop type. This count thus represents the relative angular displacement of one of the disks and hence one of the rotors relative to the other. The counter 5 has an electronic output 5a representing the accumulated count which can register upon an indicating instrument or can be used to control the motor speeds in dependence upon the measured relative angular positions of the magnetic-pole rotors.

When a predetermined angular offset of the two rotors is desired, the converter 2b can, for example, be provided in circuit with a phase shifter 13.

We claim:

1. A system for measuring the relative angular positions of the magnetic-pole rotors of two synchronous motors, comprising:
    a single frequency generator energizing both of said synchronous motors for driving same at rates determined by the frequency of said generator;
    respective optoelectronic devices connected to said rotors for generating respective pulses upon each revolution of the respective rotor;
    a start-stop counter having a start input, a stop input and a count input;
    means connecting one of said optoelectronic devices to said start input and the other of said optoelectronic devices to said stop input; and
    a phase-locked loop frequency multiplier connected between said frequency generator and said count input to feed pulses to said counter in the interval between receipt of start and stop pulses from said optoelectronic devices at a rate constituting a multiple of the frequency of said generator, the count registered in said counter representing the relative positions of said rotors.

2. The system defined in claim 1 wherein said motors are driven from said frequency generator through respective frequency converters.

3. The system defined in claim 1 wherein a phase shifter is provided between one of said motors and said frequency generator.

4. The system defined in claim 1 wherein said counter has an electronic output.

5. A method of measuring the relative angular positions of two magnetic-pole rotors of respective synchronous motors driven by a common frequency generator at the same speed, said method comprising the steps of:
    driving both of said motors by said frequency generator at a speed determined by the frequency thereof:
    generating a start pulse for each rotation of one of said rotors;
    generating a stop pulse for each rotation of the other of said rotors;
    starting a counter with said start pulse;
    stopping said counter with said stop pulse; and
    applying pulses to said counter at a multiple of the frequency of said frequency generator whereby said counter registers the supply pulses between application of the start and stop pulses.

* * * * *